(12) United States Patent
Ikehara et al.

(10) Patent No.: US 6,191,438 B1
(45) Date of Patent: Feb. 20, 2001

(54) LIGHT EMITTING DIODE ARRAY

(75) Inventors: Masahiro Ikehara, Nara; Takahiro Obana, Yamatokoriyama, both of (JP)

(73) Assignee: Sharp Kabushiki Kaisha, Osaka (JP)

( * ) Notice: Under 35 U.S.C. 154(b), the term of this patent shall be extended for 0 days.

(21) Appl. No.: 09/086,583

(22) Filed: May 29, 1998

(30) Foreign Application Priority Data

May 30, 1997 (JP) .................................................. 9-141452

(51) Int. Cl.[7] .................................................. H01L 33/00
(52) U.S. Cl. .............................. 257/99; 257/448; 257/88; 257/90; 257/93
(58) Field of Search ................................ 257/98, 99, 88, 257/90, 446, 448, 93

(56) References Cited

U.S. PATENT DOCUMENTS

| 5,138,404 | 8/1992 | Ishikawa et al. . | |
|---|---|---|---|
| 5,196,718 | 3/1993 | Sasagawa . | |
| 5,386,139 | 1/1995 | Idei et al. . | |
| 5,406,095 | 4/1995 | Koyama et al. . | |
| 5,408,488 | 4/1995 | Kurihara et al. . | |
| 5,457,328 | * 10/1995 | Ishimatsu et al. | 257/95 |
| 5,610,413 | * 3/1997 | Fan et al. | 257/97 |
| 5,744,829 | * 4/1998 | Murasato et al. | 257/94 |
| 5,753,941 | * 5/1998 | Shin et al. | 257/98 |
| 5,821,569 | * 10/1998 | Dutta | 257/96 |

FOREIGN PATENT DOCUMENTS

| 52-142490 | 11/1977 | (DE) . |
|---|---|---|
| 0 683 527 | 11/1995 | (EP) . |
| 62-16583 | 1/1987 | (JP) . |
| 6-103759 | 7/1991 | (JP) . |
| 4-100278 | 2/1992 | (JP) . |
| 5-327015 | 12/1993 | (JP) . |
| 6-291364 | 10/1994 | (JP) . |
| 8-64864 | 3/1996 | (JP) . |

\* cited by examiner

Primary Examiner—Jerome Jackson, Jr.
(74) Attorney, Agent, or Firm—Nixon & Vanderhye P.C.

(57) ABSTRACT

A light emitting diode array includes a plurality of light emitting elements, provided on a substrate having a first conductivity type, for causing light to pass through a first area thereof. Each of the plurality of light emitting elements includes an active layer; a first cladding layer having the first conductivity type and a second cladding layer having a second conductivity type provided so as to interpose the active layer therebetween; and a current diffusion layer having the second conductivity type. The current diffusion layers respectively included in the plurality of light emitting elements are isolated from one another, and an area including the current diffusion layer is included in the first area.

6 Claims, 5 Drawing Sheets

LIGHT EMITTING DIODE ARRAY

BACKGROUND OF THE INVENTION

1. Field of the Invention

The present invention relates to a light emitting diode array, and in particular to a light emitting diode array usable for data-back units of, for example, printer heads and cameras.

2. Description of the Related Art

A conventional light emitting diode array and a method for producing the same are disclosed in, for example, Japanese Laid-Open Publication No. 8-64864 filed by Sharp Kabushiki Kaisha and entitled "Light-Emitting Diode Array and Method for Fabricating the Same" (corresponding U.S. patent application Ser. No. 08/516,409). The light emitting diode array disclosed in the above-mentioned publication is shown in FIGS. 7 through 10.

FIG. 7 is a plan view of the conventional light emitting diode array. The light emitting diode array has seven light emitting elements 100. FIG. 8 is a plan view of one of the light emitting elements 100, and FIG. 9 is a cross-sectional view of the light emitting element 100 taken along lines IX—IX in FIG. 8. FIG. 10 is a partial isometric view of the light emitting diode array shown in FIGS. 7 through 9.

As best shown in FIG. 9, the light emitting element 100 includes an n-type GaAs substrate 50, an n-type GaAs buffer layer 51, an n-type $Al_{0.5}In_{0.5}P$ cladding layer 52, an undoped $(Al_{0.3}Ga_{0.7})_{0.5}In_{0.5}P$ active layer 53, a p-type $Al_{0.5}In_{0.5}P$ cladding layer 54, and an $Al_{0.7}Ga_{0.3}As$ current diffusion layer 55. The layers 51 through 55 are sequentially provided on the n-type GaAs substrate 50 in this order and formed by MOCVD.

The light emitting element 100 further includes an insulative layer 56 provided on the current diffusion layer 55. The insulative layer 56 is formed by forming an $SiN_x$ layer by plasma CVD on the current diffusion layer 55 and then performing photolithography and etching using buffered hydrogen fluoride. The insulative layer 56 is provided for preventing an electric current from being injected below a bonding pad 59 described below.

The light emitting element 100 further includes a p-side electrode 57 formed of a Ti/AuZn material and provided on the current diffusion layer 55 so as to cover the insulative layer 56, an n-side electrode 58 formed of an AuGe/Ni material and provided on a rear surface of the substrate 50, and the bonding pad 59 provided on the p-side electrode 57 preferably by sputtering Ti/Au. Red light mainly comes out from an area 155 of the current diffusion layer 55 on which the insulative layer 56 is not formed.

The conventional light emitting diode shown in FIGS. 7 through 10 includes the current diffusion layer 55 in an area where it is not desirable to cause light to pass, namely, an area other than the area 155. Accordingly, a light emission driving current expands through the current diffusion layer, and thus light passes an area where light passage is not desired. That is, the current diffusion layer acts as a light guide, thus causing light to pass an area where light passage is not desired. As a result, the light emitting point of each light emitting element is blurred.

SUMMARY OF THE INVENTION

A light emitting diode array according to the present invention includes a plurality of light emitting elements, provided on a substrate having a first conductivity type, for causing light to pass through a first area thereof. Each of the plurality of light emitting elements comprises an active layer; a first cladding layer having the first conductivity type and a second cladding layer having a second conductivity type provided so as to interpose the active layer therebetween; and a current diffusion layer having the second conductivity type. The current diffusion layers respectively included in the plurality of light emitting elements are isolated from one another, and an area including the current diffusion layer is included in the first area.

In one embodiment of the invention, each of the plurality of light emitting elements further comprises an insulative layer provided in contact with one of the active layer and the second cladding layer; an electrode provided on the insulative layer and electrically connected to the current diffusion layer; and an electrode pad provided on the electrode.

In one embodiment of the invention, the current diffusion layer has a mesa-shaped cross-section, and the electrode is provided so as to cover the entirety of a side surface of the current diffusion layer, the side surface facing the electrode pad.

In one embodiment of the invention, the active layer is formed of $(Al_xGa_{1-x})_yIn_{1-y}P$ ($0 \leq x \leq 1$, $0 \leq y \leq 1$).

In one embodiment of the invention, the current diffusion layers of the plurality of light emitting elements are arranged substantially linearly.

Thus, the invention described herein makes possible the advantage of providing a light emitting diode array for improving the light emitting efficiency and offering a clear and sharp light emitting point by preventing light from propagating to an undesired area.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

In the following examples, impurity concentrations of layers, layer thicknesses and layer formation methods are exemplary, and the present invention is not limited to these numerical figures and methods.

EXAMPLE 1

Figure 1:
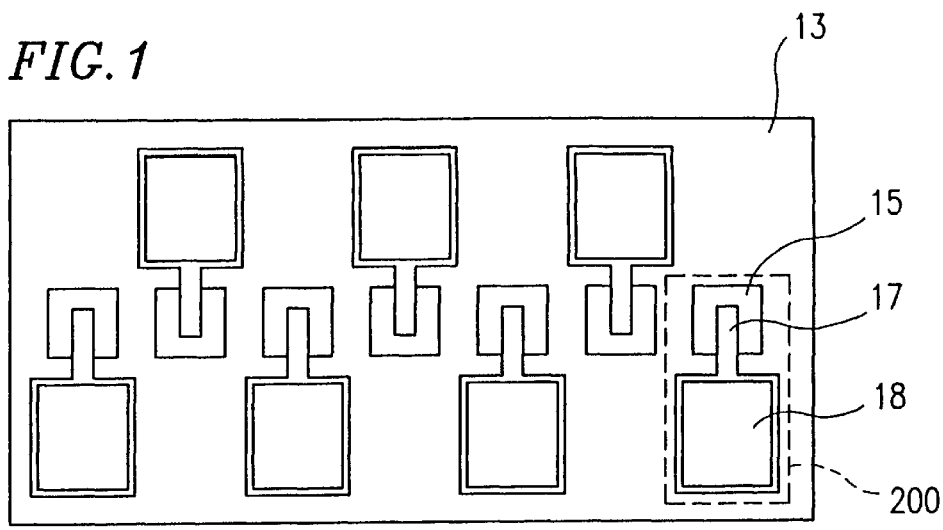
FIG. 1 is a plan view of a light emitting diode array in a first example according to the present invention.
Figure 2:
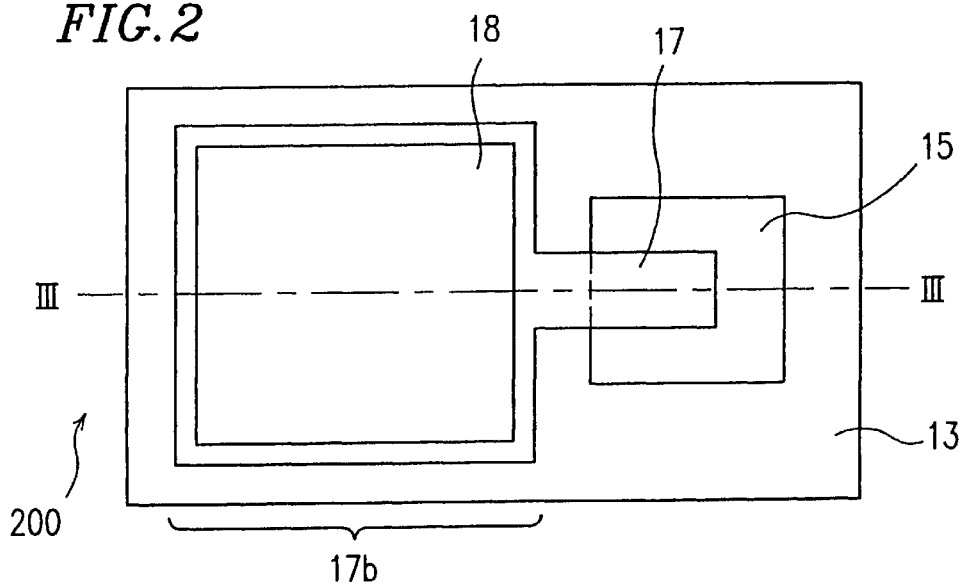
FIG. 2 is a plan view of one light emitting element included in the light emitting diode array shown in FIG. 1.
Figure 3:
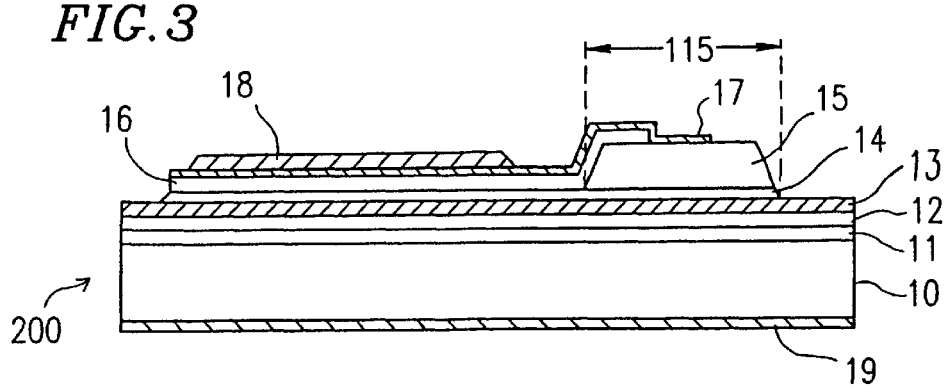
FIG. 3 is a cross-sectional view of the light emitting element shown in FIG. 2 taken along line III—III in FIG. 2.
Figure 4:
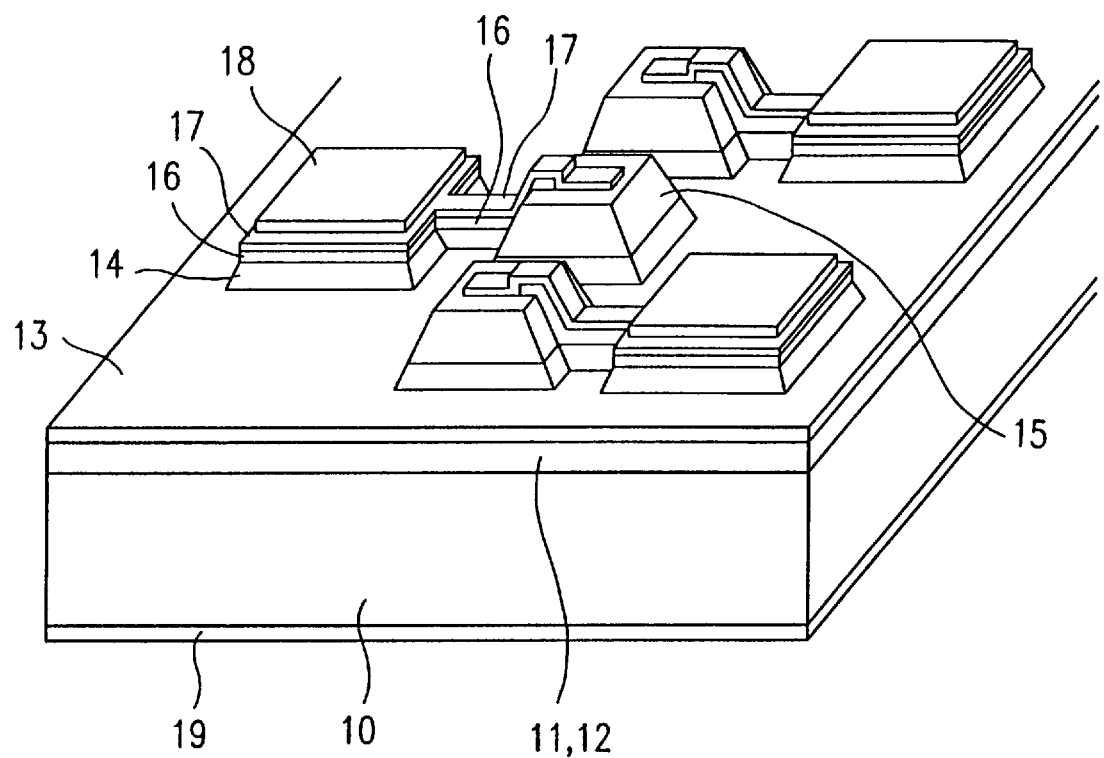
FIG. 4 is a partial isometric view of the light emitting diode array shown in FIG. 1.

FIG. 1 is a plan view of a light emitting diode array in a first example according to the present invention. The light emitting diode array in the first example includes seven light emitting elements 200. FIG. 2 is a plan view of one of the light emitting elements 200, and FIG. 3 is a cross-sectional view of the light emitting element 200 taken along line III—III in FIG. 2. FIG. 4 is a partial isometric view of the light emitting diode array shown in FIGS. 1 through 3. A method for producing the light emitting element 200 will be described with reference to FIG. 3.

First, the following layers are sequentially formed on an n-type GaAs substrate 10 in the following order preferably by MOCVD: an n-type GaAs buffer layer 11 (n-type impurity concentration: preferably $5 \times 10^{17}$ cm$^{-3}$), an n-type $Al_{0.5}In_{0.5}P$ cladding layer 12 (first cladding layer; n-type impurity concentration: preferably $5 \times 10^{17}$ cm$^{-3}$), an undoped $(Al_{0.3}Ga_{0.7})_{0.5}In_{0.5}P$ active layer 13, a p-type $Al_{0.5}In_{0.5}P$ cladding layer 14 (second cladding layer; p-type impurity concentration: preferably $3 \times 10^{17}$ cm$^{-3}$), and a p-type $Al_{0.7}Ga_{0.3}As$ current diffusion layer 15. In this example, n-type is a first conductivity type, and p-type is a second conductivity type. The layers 11 through 15 have approximate thicknesses of, for example, 0.5 $\mu$m, 1 $\mu$m, 0.6 $\mu$m, 1 $\mu$m and 3 $\mu$m, respectively.

Next, the current diffusion layer 15 is partially removed preferably by photolithography, etching using a sulfuric acid:hydrogen peroxide etchant and treatment using heated phosphoric acid until the p-type cladding layer 14 or the undoped active layer 13 is exposed, thereby shaping the current diffusion layer 15 to have a mesa-shaped cross-section (hereinafter, sometimes referred to as the "mesa-shaped current diffusion layer"). In this manner, the current diffusion layers 15 included in every two adjacent light emitting elements 200 are physically isolated from each other. As the degree of mesa-etching is deeper, namely, when the mesa-etching is performed until the active layer 13 is exposed instead of the p-type cladding layer 14, the current diffusion layers 15 of the second conductivity type are isolated better electrically and optically. For practical use, however, mesa-etching performed until the p-type cladding layer 14 is exposed is sufficient.

Then, an insulative SiN$_x$ layer 16 is formed preferably by plasma CVD on the p-type cladding layer 14 so as to cover the mesa-shaped current diffusion layer 15, and then patterned preferably by photolithography and etching using buffered hydrogen fluoride. As shown in FIGS. 2 and 3, the insulative layer 16 is etched so as to leave partially covered a top surface and a side surface of the etched current diffusion layer 15 including a top edge thereof as well as a top surface of the p-type cladding layer 14 or the undoped active layer 13.

Next, Ti/AuZn is sputtered toward the patterned insulative layer 16 and the current diffusion layer 15, and photolithography and etching using an iodine etchant and diluted hydrogen fluoride are performed. Then, the resultant layer is heated, thereby forming a p-side electrode 17.

On a rear surface of the n-type GaAs substrate 10, AuGe/Ni is deposited and heated, thereby forming an n-side electrode 19. Ti/Au is sputtered toward the p-side electrode 17, and photolithography and chemical etching using an iodine etchant and diluted hydrogen fluoride are performed. Thus, a bonding pad (electrode pad) 18 is formed on the p-side electrode 17.

Below the bonding pad 18 and the p-side electrode 17, the p-type cladding layer 14 remains. Accordingly, even when pin-holes are made in the insulative layer 16, no leak current which does not pass the PN junction is generated. Thus, the pin-holes in the insulative layer 16 do not result in a defect in the electric characteristics. Moreover, the p-type cladding layer 14 has a higher resistance than that of the current diffusion layer 15. Accordingly, the injected current flows only through the PN junction below the current diffusion layer 15. Therefore, substantial light passage does not occur in an area of the p-type cladding layer 14 which is below the electrode pad 18. Even though light passage occurs, the light is blocked by the electrode pad 18. Thus, a light leak from the vicinity of the electrode pad 18 is prevented.

As shown in FIG. 3, the electrode pad 18 is provided above the insulative layer 16 with the p-side electrode 17 interposed therebetween, the insulative layer 16 being in contact with the active layer 13 or the p-type cladding layer 14. Thus, the electrode pad 18 blocks the light which is propagated from an area of a light emitting area below the electrode pad 18. In this specification, the light emitting area includes the active layer 13, the n-type cladding layer 12 and the p-type cladding layer 14.

Since the current diffusion layer 15 is formed only in a desirable light passing area 115 (first area; having a size of about 40 $\mu$m to 100 $\mu$m×40 $\mu$m to 100 $\mu$m), red light having a wavelength of about 590 nm comes out from the light passing area 115 with high efficiency. In this specification, the current diffusion layer acts as the light passing area.

In the first example, the monolithic light emitting diode array uses direct-transition-type $(Al_{0.3}Ga_{0.7})_{0.5}In_{0.5}P$ for the active layer 13 (light emitting layer) and the current diffusion layer 15 obtained as a result of mesa-etching. These elements improve the light emitting efficiency of the light emitting diode array in the first example. The mesa-shaped current diffusion layer 15 is also advantageous in preventing an electric current injected into one light emitting element 200 from flowing into another light emitting element 200, and also is advantageous in causing the current to flow into the light emitting point in the light emitting element 200 in a concentrated manner. Thus, the light emitting point is clear and sharp. The current diffusion layer 15 is also prevented from acting as a light guide which expands the light into an area of light emitting element 200 other than the light passing area 115.

Although the undoped $(Al_{0.3}Ga_{0.7})_{0.5}In_{0.5}P$ is used for the active layer 13 in the first example, a p-type active layer or an n-type active layer can be used as necessary.

EXAMPLE 2

Figure 5:
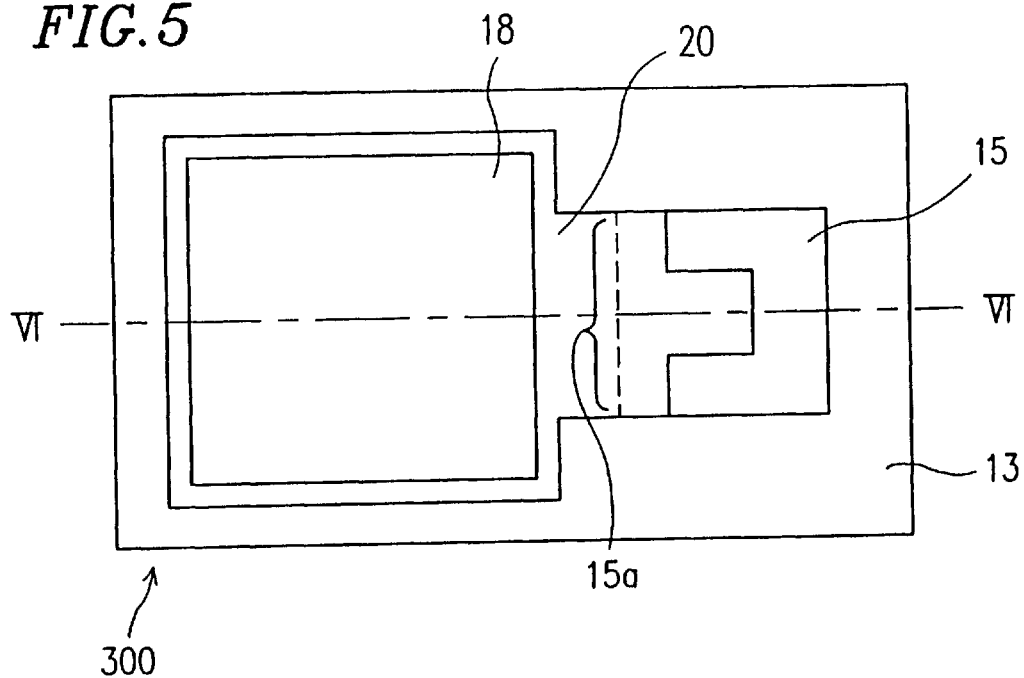
FIG. 5 is a plan view of one light emitting element included in a light emitting diode array in a second example according to the present invention.
Figure 6:
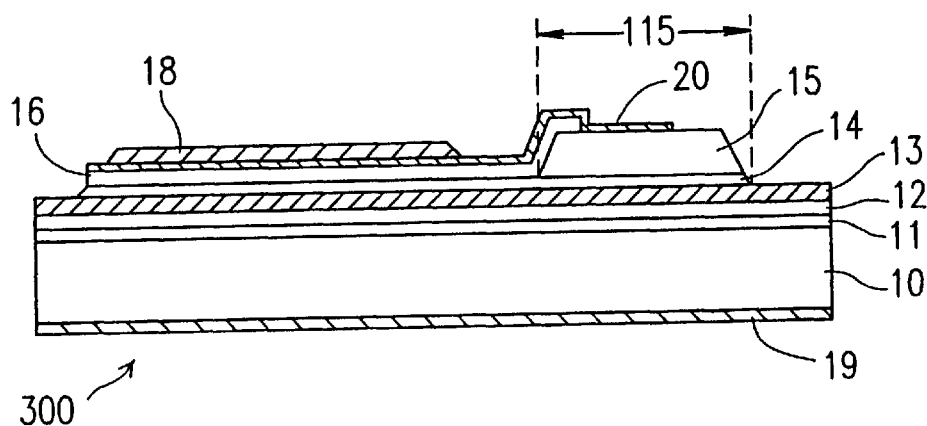
FIG. 6 is a cross-sectional view of the light emitting element shown in FIG. 5 taken along line VI—VI in FIG. 5.
Figure 7:
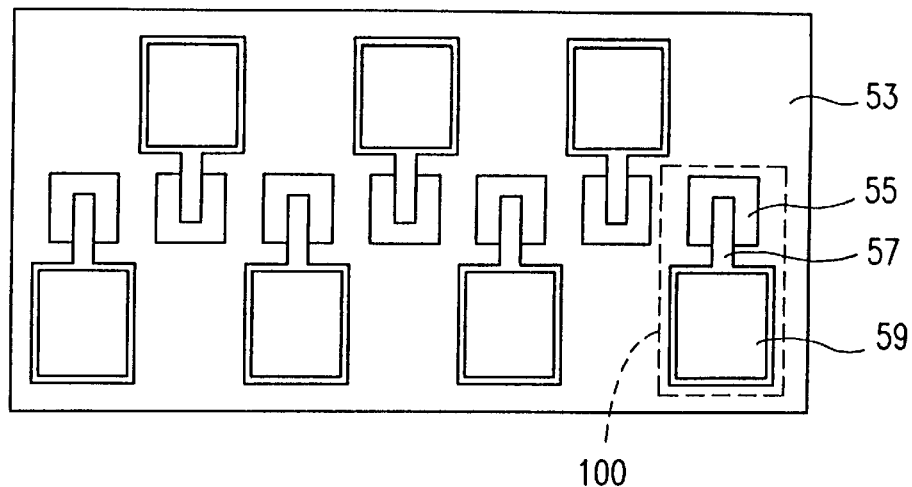
FIG. 7 is a plan view of a conventional light emitting diode array.
Figure 8:
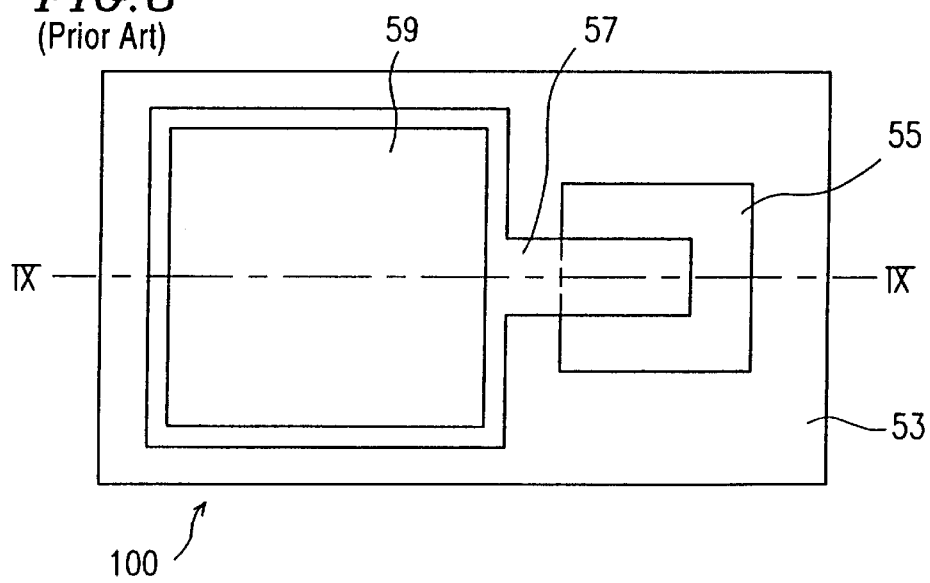
FIG. 8 is a plan view of one light emitting element included in the conventional light emitting diode array shown in FIG. 7.
Figure 9:
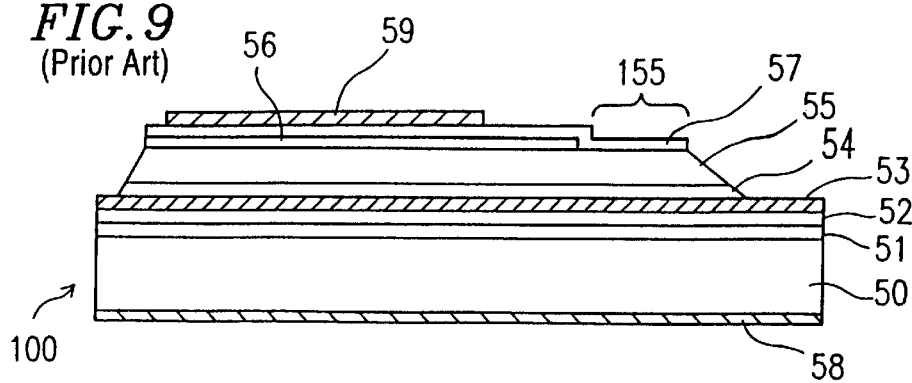
FIG. 9 is a cross-sectional view of the light emitting element shown in FIG. 8 taken along line IX—IX in FIG. 8.
Figure 10:
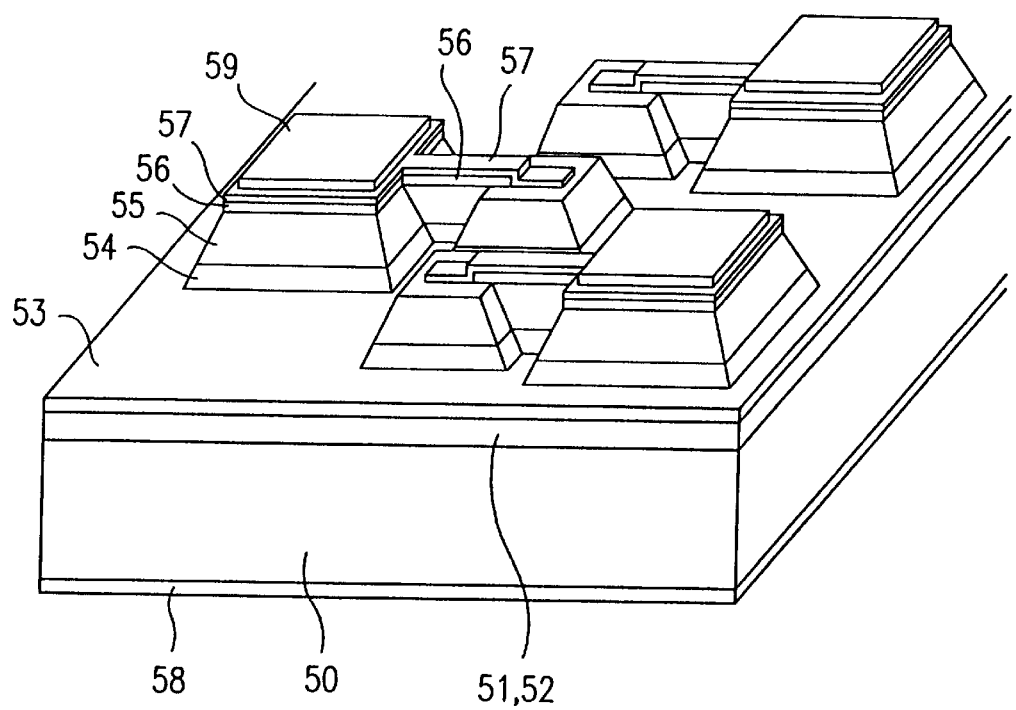
FIG. 10 is a partial isometric view of the conventional light emitting diode array shown in FIG. 7.

A light emitting diode array according to the present invention can include a plurality of light emitting elements having a different structure. In the second example, such a light emitting element 300 will be described with reference to FIGS. 5 and 6. FIG. 5 is a plan view of the light emitting element 300, and FIG. 6 is a cross-sectional view thereof taken along line VI—VI in FIG. 5. Identical elements previously discussed with respect to FIGS. 1 through 4 bear identical reference numerals and the descriptions thereof will be omitted.

As best shown in FIG. 5, a metal electrode 20 is extended from a top surface of the current diffusion layer 15 so as to cover the entirety of a side surface 15a of the current diffusion layer 15, the side surface 15a facing the electrode pad 18. Due to this structure, light from the side surface 15a of the current diffusion layer 15 is prevented from propagating to an area of the light emitting element 300 other than the light passing area (corresponding to the light passing area 115 in FIG. 3).

A method for producing the light emitting element 300 will be described with reference to FIG. 6.

First, the following layers are sequentially formed on an n-type GaAs substrate 10 in the following order preferably by MOCVD: an n-type GaAs buffer layer 11 (n-type impurity concentration: preferably $5 \times 10^{17}$ cm$^{-3}$), an n-type $Al_{0.5}In_{0.5}P$ cladding layer 12 (first cladding layer; n-type impurity concentration: preferably $5 \times 10^{17}$ cm$^{-3}$), an undoped $(Al_{0.3}Ga_{0.7})_{0.5}In_{0.5}P$ active layer 13, a p-type $Al_{0.5}In_{0.5}P$ cladding layer 14 (second cladding layer; p-type impurity concentration: preferably $3 \times 10^{17}$ cm$^{-3}$), and a p-type $Al_{0.7}Ga_{0.3}As$ current diffusion layer 15. In this example, n-type is a first conductivity type, and p-type is a second conductivity type. The layers 11 through 15 have approximate thicknesses of, for example, 0.5 μm, 1 μm, 0.6 μm, 1 μm and 3 μm, respectively.

Next, the current diffusion layer 15 is partially removed preferably by photolithography, mesa-etching using a sulfuric acid:hydrogen peroxide etchant and treatment using heated phosphoric acid until the p-type cladding layer 14 or the undoped active layer 13 is exposed, thereby shaping the current diffusion layer 15 to have a mesa-shaped cross-section. In this manner, the current diffusion layers 15 included in every two adjacent light emitting elements 300 are physically isolated from each other.

Then, an insulative SiNx layer 16 is formed preferably by plasma CVD on the p-type cladding layer 14 so as to cover the mesa-shaped current diffusion layer 15, and then patterned preferably by photolithography and etching using buffered hydrogen fluoride. As shown in FIGS. 5 and 6, the insulative layer 16 is formed so as to cover a top surface and a side surface of the etched current diffusion layer 15 including a top edge thereof as well as a surface of the p-type cladding layer 14 or the undoped active layer 13.

Next, Ti/AuZn is sputtered toward the patterned insulative layer 16 and the current diffusion layer 15, and photolithography and etching using an iodine etchant and diluted hydrogen fluoride are performed. Then, the resultant layer is heated, thereby forming a p-side electrode 20. As described above, the p-side electrode 20 covers the entirety of the side surface 15a of the current diffusion layer 15, whereas the p-side electrode 17 in the first example partially covers the side surface of the current diffusion layer 15. The structure in the second example further prevents light from the side surface 15a of the current diffusion layer 15 from propagating to an area of the light emitting element 300 other than the light passing area (corresponding to the light passing area 115 in FIG. 3).

On a rear surface of the n-type GaAs substrate 10, AuGe/Ni is deposited and heated, thereby forming an n-side electrode 19. Ti/Au is sputtered toward the p-side electrode 20, and photolithography and chemical etching using an iodine etchant and diluted hydrogen fluoride are performed. Thus, a bonding pad (electrode pad) 18 is formed on the p-side electrode 20.

In the second example, the monolithic light emitting diode array uses the mesa-shaped current diffusion layer 15 and the metal electrode 20 covering the entirety of the side surface 15a. Accordingly, light from the side surface 15a of the current diffusion layer 15 is blocked. As a result, a clearer and sharper light emitting point is obtained.

Although the undoped $(Al_{0.3}Ga_{0.7})_{0.5}In_{0.5}P$ is used for the active layer 13 in the second example, a p-type active layer or an n-type active layer can be used as necessary. As an alternative structure, a multiple-layer reflection layer including 20 pairs of n-type $Al_{0.5}In_{0.5}P$ layers (n-type impurity concentration: preferably $5 \times 10^{17}$ cm$^{-3}$) and n-type $(Al_{0.4}Ga_{0.6})_{0.5}In_{0.5}P$ layers (n-type impurity concentration: preferably $5 \times 10^{17}$ cm$^{-3}$) can be provided between the n-type GaAs buffer layer 11 (n-type impurity concentration: preferably $5 \times 10^{17}$ cm$^{-3}$) and the n-type $Al_{0.5}In_{0.5}P$ cladding layer 12 (n-type impurity concentration: preferably $5 \times 10^{17}$ cm$^{-3}$). Such a structure further improves the light emitting efficiency.

Hereinafter, the slope of the side surfaces of the current diffusion layer 15 will be described. For example, in the case where an off-angle of the semiconductor substrate 10 during MOCVD is changed from the (100) plane to (111) plane, when a side 17b (FIG. 2) becomes parallel to the <110> orientation, a significantly slowly-curved slope is generated particularly in one direction. Such a slope is applicable to the light emitting element shown in FIGS. 5 and 6. In the case where the side 17b of the current diffusion layer 15 cannot be parallel to the <110> orientation, the light emitting area is patterned so that the side surface 17b is parallel to the <100> orientation. The light emitting area includes the active layer, the p-type cladding layer and the n-type cladding layer.

As described above, a light emitting diode array according to the present invention improves the light emitting efficiency (external light emitting efficiency), and also prevents an electric current injected into one light emitting element from being injected to the other light emitting elements. Moreover, the current flows only to the light emitting point in the light emitting element in a concentrated manner, and thus the light emitting point is clear and sharp.

In the case where the current diffusion layer is provided only in a designed light passing area (first area), the current diffusion layer is prevented from acting as a light guide which expands the light to an area of the light emitting element other than the light passing area. Such a structure also provides a clear and sharp light emitting point.

The light emitting diode array can have a structure, in which an electrode pad is provided above the insulative layer with an electrode connected to the current diffusion layer interposed therebetween. The insulative layer is in contact with the active layer and the cladding layer having the second conductivity type. In such a case, even when light propagates to an area in the cladding layer having the second conductivity type below the electrode pad, the light is blocked by the electrode pad and thus is not leaked from the vicinity of the electrode pad.

In the case where a metal electrode is provided so as to cover the entirety of a surface of the current diffusion layer, the light from the current diffusion layer is blocked and thus prevented from propagating to an area of the light emitting element other than the light passing area. Thus, a clear and sharp light emitting point is obtained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A light-emitting diode array comprising:
   a semiconductor substrate of a first conductivity type, and
      a plurality of light-emitting elements arranged on the substrate;

each of the plurality of light-emitting elements comprising:
  an active layer disposed between a first cladding layer of the first conductivity type and a second cladding layer of a second conductivity type;
  a current diffusion layer of the second conductivity type, the current diffusion layer being formed on only a portion of the second cladding layer;
  an insulating layer contacting one of the active layer and the second cladding layer;
  an electrode formed on the insulating layer and electrically connected to the current diffusion layer; and
  an electrode pad formed on the electrode,
wherein the electrode pad and the current diffusion layer do not overlap.

2. A light-emitting diode array according to claim 1, wherein the insulating layer partly covers a side surface of the current diffusion layer.

3. A light-emitting diode array according to claim 1, wherein the active layer is formed of $(Al_xGa_{1-x})_y In_{1-y}P$ ($0 \leq x \leq 1$, $0 \leq y \leq 1$).

4. A light-emitting diode array comprising: a semiconductor substrate of a first conductivity type, and a plurality of light-emitting elements arranged on the substrate;
  each of the plurality of light-emitting elements comprising:
    an active layer disposed between a first cladding layer of the first conductivity type and a second cladding layer of a second conductivity type;
    a current diffusion layer of the second conductivity type formed on only part of said second cladding layer, wherein the second cladding layer has a higher resistance than the current diffusion layer so that the flow of an injected current is concentrated in the PN junction below the current diffusion layer;
    an insulating layer contacting one of the active layer and the second cladding layer;
    an electrode formed on the insulating layer and electrically connected to the current diffusion layer; and
    an electrode pad formed on the electrode,
wherein the electrode pad and the current diffusion layer do not overlap.

5. A light-emitting diode array according to claim 1, wherein the current diffusion layer of each light-emitting element is formed only in a light-emitting area thereof.

6. A light-emitting diode array according to claim 4, wherein the current diffusion layer of each light-emitting element is formed only in a light-emitting area thereof.

* * * * *